United States Patent [19]

Hattori et al.

[11] Patent Number: 5,012,478
[45] Date of Patent: Apr. 30, 1991

[54] MONOLITHIC MULTIPLE BEAM SEMICONDUCTOR LASER

[75] Inventors: Ryo Hattori; Hitoshi Kagawa; Masaki Mori, all of Itami, Japan

[73] Assignee: Mitsubishi Denki Kabushiki Kaisha, Tokyo, Japan

[21] Appl. No.: 412,095

[22] Filed: Sep. 25, 1989

[30] Foreign Application Priority Data

Sep. 27, 1988 [JP] Japan .................. 63-243375

[51] Int. Cl.⁵ .............................................. H01S 3/19
[52] U.S. Cl. ...................................... 372/50; 437/129; 375/49
[58] Field of Search ........................... 372/49, 50, 20; 437/129

[56] References Cited

U.S. PATENT DOCUMENTS

| | | | |
|---|---|---|---|
| 4,147,409 | 3/1979 | Apfel | 372/49 |
| 4,852,112 | 7/1989 | Kagawa et al. | 372/49 |
| 4,855,256 | 8/1989 | Kabayashi et al. | 437/129 |
| 4,891,816 | 1/1990 | Yoshida et al. | 372/50 |
| 4,899,359 | 2/1990 | Yano et al. | 372/50 |

OTHER PUBLICATIONS

"A New Monolithic Dual GaAlAs Laser Array for Read/Write Optical Disk Applications", Kume et al., IEEE Journal of Quantum Electronics, vol. QE23, No. 6, Jun. 1987, pp. 898-901.

Primary Examiner—James W. Davie
Attorney, Agent, or Firm—Leydig, Voit & Mayer

[57] ABSTRACT

A monolithic multiple beam semiconductor laser having a low power and a high power beam. A number of factors in the laser are coordinated in order to assure that both the low and high power beams operate at precisely the same frequency. The front and rear facet reflectances of the respective low and high power cavities are coordinated to each other and to the rated operating power levels of the respective lasers to achieve the same operating frequency from both beams. In a particular example, the low power cavity has front and rear facet reflectivities of 30% and a rated output power of 3 mw. The high power cavity has a rated operating power of 20 mw, a front facet reflectivity of 2%, and a rear facet reflectivity of 60%.

5 Claims, 5 Drawing Sheets

MONOLITHIC MULTIPLE BEAM SEMICONDUCTOR LASER

FIELD OF THE INVENTION

This invention relates to semiconductor lasers, and more particularly to monolithic multiple beam lasers such as monolithic dual beam lasers.

BACKGROUND OF THE INVENTION

A significant application for dual beam lasers involves writing and reading optical disks, such as the direct read after write (DRAW) systems currently being considered. It is well know that writing of an optical disk requires a comparatively high power laser, capable of producing 20 or more milliwatts of output power. By way of contrast, the reading laser is a relatively low power device, such as a 3 milliwatt laser, but requires very low noise operation, such as a signal-to-noise ratio S/N of about 90 dB or less.

In the past, separate lasers have been used for the low power reading source and the high power writing source, and optics have been provided capable of focusing the beams from either source on the precise point on the optical disk to be read or written. When dual beam monolithic devices are used, the laser cavities which produce the beams are very close together, and it is difficult to provide separate optics for the two beams. In that case, it is important that both lasers operate at almost precisely the same wavelength. If they do not, and the beams are at two separate wavelengths, the chromatic aberration introduced by the system optics tends to focus the beams at two different points on the optical media, such that writing and reading, although intended to be from the same bit of the optical memory, is not. To compensate for the slightly different wavelength produced by the reading and writing lasers in the past, focusing systems have been considered which slightly alter the focus between reading and writing to compensate for the change in focus resulting from the wavelength shift. However, those systems not only introduce complications in the automatic focusing systems which must be provided, but also introduce costs associated with such systems as well as reduced speed of response necessary to await the focusing action before the system can switch between reading and writing. Thus, while DRAW systems can be considered to represent a significant advance in the optical recording and readout art, they are not without their difficulties, particularly in providing sources for the high and low power writing and reading lasers which are adequately compatible in output wavelength, as well as compatible with the requirements of the power output and noise requirements conventionally imposed on separate laser devices.

One prior art approach to configuring a monolithic dual beam laser is illustrated in FIG. 7. The details of the substrate and epitaxially grown layers which make up the laser are not shown, since they can be conventional. Suffice it to say that in many cases lasers used for reading and writing of optical disks employ a conventional GaAs/AlGaAs double heterostructure technology, often of the type which uses current confinement structures for separating the two closely spaced laser devices formed on the same substrate. Thus, FIG. 7 shows the structure of a dual beam semiconductor laser having separate laser sections or cavities A, B, laser section A being a high power device dedicated to the writing operation and laser section B being a low power, low noise device dedicated to the reading operation. The high power laser A has a front facet 1 from which the laser beam emanates, and similarly, the low power laser B has a front facet 2 from which the low power laser beam emanates. The front facets are coated at 3, 4 and the rear facets also coated at 5, 6 to control the reflectivities of the respective facets. It will be appreciated that the reflectivities control the reflection of laser light within the laser cavities and thereby the light which is emitted through the respective facets and particularly the output power which is emitted through the front facets 1, 2. Since the laser devices A, B are intended for independent control, a separation groove 7 is provided to separate the laser devices A, B. The separation groove 7 is typically implemented by means of separate current confinement structures associated with the laser active layers, as well as by separate electrodes for the sections A, B, as is well known to those skilled in this art.

In a typical prior art approach to configuring a laser according to FIG. 7, the front and rear facet reflectances of the high power section A are established at about 2% for the front facet and at about 90% for the rear facet. Those values are typically selected to achieve what is known as asymmetrical reflectance coating for the high power laser. A symmetrical coatng renders the rear facet highly reflective and the front facet highly transparent, so as to concentrate output power in the main output beam for high power operation. The low reflectivity of the front facet, while achieving high power in the output beam, does so at the expense of signal-to-noise ratio; lowering the front facet reflectivity to too great an extent renders the device susceptible to optical feedback through the front facet. In the low power laser B, noise is an even more important consideration and reflectances are established much nearer each other in order to balance the external cavity mode with the internal cavity mode and thus reduce the signal-to-noise ratio, particularly as it results from optical feedback. Thus, it has been typical in the past to coat the front facet of the low power laser diode B to achieve a reflectance of about 30% and the rear facet to achieve a reflectance of about 60%. In a conventional double heterostructure implementation, the radiation broadening angle of the emitted laser light from each of the devices A, 8 is about 30° in the vertical direction (vertical with respect to the double heterojunction) and about 10° in the parallel direction (i.e., in the plane of the active layer). When a laser diode is constructed as noted in detail above, it is possible to obtain a light output from the high power laser A of about 30 mw CW, and such power output is sufficient to operate that laser as the writing light source for an optical disk memory. As noted above, the primary consideration for the low power laser diode B is its low noise characteristic, and the prior art has been able to achieve low noise operation such as a relative intensity ncise value (RIN) of about −120 db/Hz, and such a characteristic is useful in the reading laser source for an optical disk memory.

While it would thus appear that the device of FIG. 7 is entirely suitable for near simultaneous reading and writing of an optical disk, the device has a further shortcoming which has not been altogether satisfactorily solved in the prior art. More particularly, even though the laser devices A, B are formed on the same substrate and using the same semiconductor technology, there is a slight wavelength difference in the light outputs from the devices A, B which results from their differing opeating characteristics and facet reflectances. In a typical application of a device such as shown in FIG. 7, the lasers operate in a nominal wavelength of about 780 nm (conventional for GaAs/AlGaAs heterostructure devices). When the high power device operates at about 20 mw and the low power device at about 3 mw, a difference in output wavelength between the beams of the devices A and B can exist which is on the order of 10 nm. While that might appear to be a rather insignificant difference, as noted above, the chromatic aberration inherent in the optics used with most laser disk systems will cause the two beams to focus at points which are sufficiently different (insofar as the dimensions required of the laser optical disk system is concerned) as to require differential focusing for the two beams. Thus, to use a device such as the FIG. 7 laser in a DRAW system would require focusing means which is responsive to the on or off state of the devices A and B to compensate for chromatic aberration in the optical system and the resulting wavelength shift between the two beams to bring both beams into focus at the same point.

The prior art has taken additional approaches to differentially coating the facets of a dual beam monolithic semiconductor laser, but it is not seen that art has achieved a dual beam laser where the two beams are sufficiently close in output wavelength to eliminate the need for differential focusing mechanisms to achieve precise focus of the two beams at about the same spot on the optical media.

One example of an alternate approach is set forth in a paper coauthored by one of the inventors of the present invention ("Twin Beam Laser Diode for Optical Disk Memory", Hattori et al.). There is proposed a dual beam monolithic laser, not unlike the structure of FIG. 7, in which the high power laser has its front and rear facets coated for reflectivities of 2% and 60%, respectively, and the low power laser has its front and rear facets coated for reflectivities of 32% and 60%, respectively. In that case, the 2% reflectivity of the front facet of the high power laser was dictated primarily by the high power requirements demanded of that laser, whereas the 32% reflectivity of the front facet of the low power laser was dictated primarily by the requirement for high signal to noise ratio. The 60% reflectivity for the rear facets of both the high power and low power lasers were said to be dictated primarily by the requirement for deriving adequate light for monitoring by a coupled photodiode. While the article does not state the results achieved, the device is known to have produced laser beams of output frequency which differed by about 4 nm, i.e., the high power beam differed from the center frequency of the low power beam by about ±2 nm. As such, the device was incapable of operating in a DRAW optical system without additional measures being taken to refocus one or the other of the beams or otherwise compensate for the chromatic aberration resulting from the 4 nm wavelength difference.

Another prior art approach is illustrated in "A New Monolithic Dual GaAlAs Laser Array for Read/Write Optical Disk Applications", by Kume et al., IEEE Journal of Quantum Electronics, Vol. QE23, No. 6, June 1987, pp. 898-901. That article also deals with a dual beam monolithic AlGaAs laser in which the facets are differentially coated. The high power laser is coated to have a front facet reflectivity of about 4% and a rear facet reflectivity of about 75%. The low power laser has reflectivities of about 75% at both the front and rear facets. The article sugggests that the reflectivities of the high power laser were developed to minimize operating current (and thus achieve high power), whereas the reflectivities of the low power laser were designed to minimize random mode-hopping and thus produce a low noise device. The wavelength shift is not stated in the publication, but it is believed to be similar to the other prior art discussed above in producing high power and low power beams which are sufficiently shifted in wavelength as to require special means for either correcting for chromatic aberration or tolerating the change in focus occasioned by the wavelength shift.

SUMMARY OF THE INVENTION

In view of the foregoing, it is a general aim of the present invention to provide a multiple beam (such as a dual beam) monolithic semiconductor laser in which the output beams are sufficiently close in wavelength to allow near-simultaneous use without the need for chromatic aberration compensation.

Thus, it is an object of the present invention to coordinate not only the reflectances of the facets of high and low power beams in a monolithic multiple beam laser, but also to coordinate the rated output power of the respective beams to achieve operating wavelengths from the multiple beams at nominal operating conditions which are very near each other.

Thus, in a particular end use application, an object of the present invention is to provide a monolithic laser for a DRAW optical system which dispenses with the need for chromatic aberration compensation and thus simply and accurately provides near-simultaneous reading and writing of the optical medium.

The invention provides a multiple beam monolithic laser for producing at least two output laser beams including a low power and a high power beam. The monolithic laser includes a cavity for the low power beam having front and rear facets coated to have reflectances in the range between about 25% and 33%. The low power cavity is designed to have a rated output power which is coordinated with the front and rear facet reflectances to produce output radiation at a predetermined wavelength. A cavity for the high power beam is also provided and has a front facet coated to have a reflectance in the range between about 1% and 4%, and a rear facet coated to have a reflectance in the range between about 50% and 65%. The high power cavity is designed to have a rated output power coordinated with the reflectances of the front and rear facets to produce radiation when operated at rated power which is within about 1 nm of the predetermined wavelength of the low power laser (i.e., within ±1 nm of the low power beam rated operating frequency).

It is a feature of the invention that the output wavelengths of the low and high power beams are sufficiently close to be focused at about the same spot by the same optics without the need for chromatic aberration compensation.

A further aspect of the invention provides a method for determining laser characteristics in a multiple beam monolithic laser to coordinate facet reflectances and rated laser outputs so as to produce multiple beams operated at different power levels but at the same operating wavelength.

While the invention will be described in connection with a preferred embodiment, there is no intent to limit it to that embodiment. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
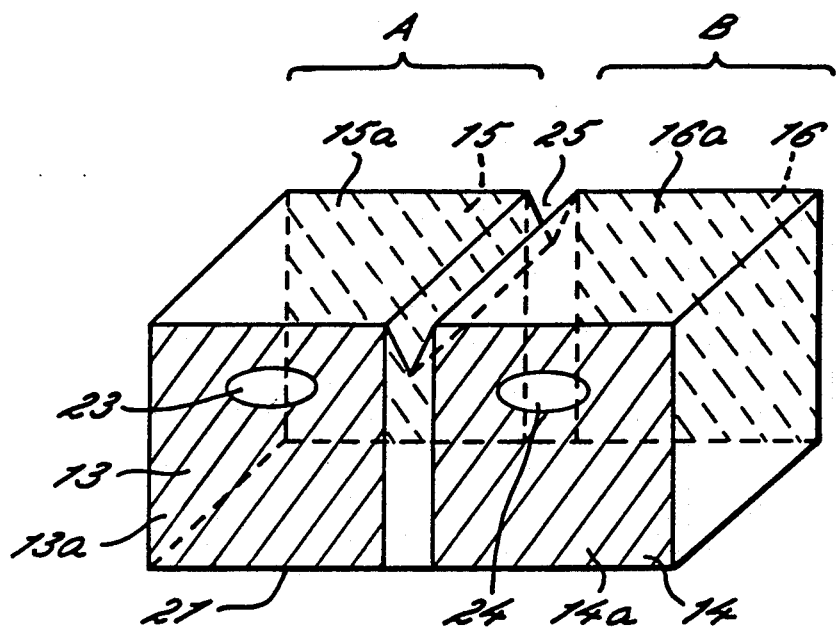
FIG. 1 is a perspective view showing a multiple beam monolithic semiconductor laser exemplifying the present invention.

Turning now to the drawings, FIG. 1 shows the structure of a monolithic multiple beam semiconductor laser exemplifying the present invention. FIG. 1 shows only a two-beam device, but it will be apparent to those skilled in the art, upon reading the following detailed description, the invention can be practiced in multiple beam laser devices having more than two beams when such an implementation is desirable. The two-beam device is emphasized as being particularly useful in the aforementioned DRAW optical systems where a high power laser is used to write individual bits in the optical memory followed immediately by a reading of such bits by the low power laser for checking the accuracy of the written information. However, both the DRAW environment and the limitation in the examples to two beam devices are both intended as exemplary of the broader invention, and for illustrating the currently preferred embodiment.

Referring then to FIG. 1, there is shown a monolithic laser structure 20 including a pair of laser diodes A, B formed on a common substrate 21. As is well known, each of the lasers A, B has a laser cavity defired between front and rear facets, the laser device A having front and rear facets 13, 15 and the laser device B having front and rear facets 14, 16. Windows 23, 24 in the front facets 13, 14 serve as the exits for light generated by the laser devices A, B. The beams of coherent radiation which are projected through the windows 23, 24 are focused, in the exemplary laser disk environment, onto particular points of the surface of the optical medium for reading or writing digital information thereon. For purposes of this description, the laser device A will be considered a high power laser capable of writing an optical disk, and the laser device B will be considered a low power laser capable of reading an optical disk. The monolithic nature of the structure 20 is emphasized by the fact that in a practical embodiment, the windows 23, 24 are spaced on about 100 micron centers to closely juxtapose the reading and writing laser beams while allowing sufficient thickness of material between such beams to minimizes thermal cross talk. The minute spacing between read and write beams minimize the effect of spherical aberration in the focusing optics, but virtually assures that only a single optical system can be used due to space limitations.

For purposes of separately controlling the two laser beams, a separation groove 25 divides the laser devices A, B for independent operation. As is well known to those skilled in this art, the separation groove 25 is representative of means for dividing the current flow between the lasers A, B, and further represents the separation of the electrodes (not shown) which drive the individual sections of the laser. Suffice it to say that the laser is fabricated such that the same materials are used to make up the device so as to achieve the same wavelength of light generated, while the structure is such as to allow separate current flow to the individual lasers A, B so that the emitted laser beams can be separately controlled.

In practicing the invention, the facets 13-16 carry coating 13a-16a of material which provides reflectances which are coordinated to each other and to the rated power outputs of the laser devices such that the beams emitted through the windows 23, 24 are of substantially the same wavelength, with little if any wavelength difference in the light emitted from those windows. To that end, the front facet 13 of the high power laser A receives a coating 13a which provides the front facet with a reflectivity in the range between about 1% and 4%. Similarly, the front facet 14 of the low power laser B carries a coating 14a which provides that facet with a reflectivity in the range between about 25% and 33%. The rear facet 15 of the high power laser is coated at 15a to have a reflectivity in the range between about 50% and 65% whereas the rear facet 16 of the low power laser is provided with a coating 16a to make facet 16 reflective in the range between about 25% and 33%. The manner in which the particular reflectivities for those facets within those ranges is selected and coordinated to the rated output power of the respective laser devices A, B will now be described.

Figure 2:
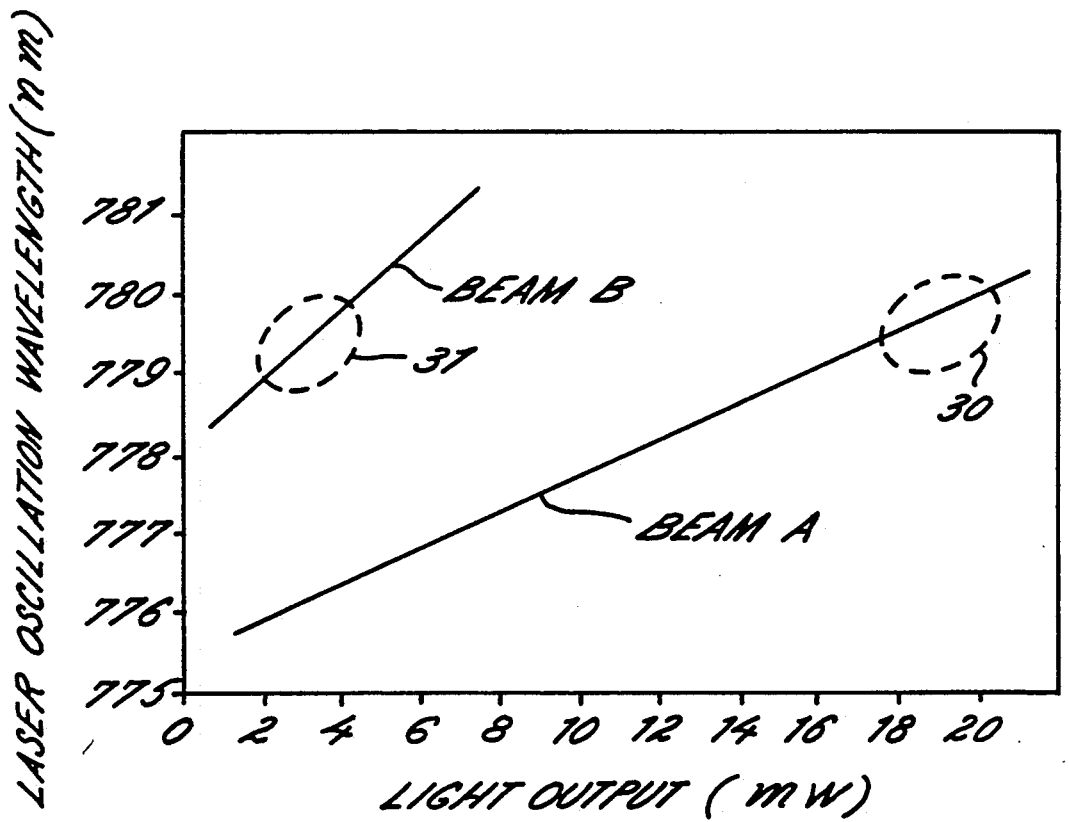
FIG. 2 is a diagram showing the relationship between the laser oscillation wavelength and power output of the two beams of the laser device of FIG. 1.

FIG. 2 is useful in illustrating the manner in which the laser characteristics are coordinated, in that it illustrates the wavelength of the produced light for the laser beams A, B as a function of the light output of the respective devices. It is seen that the low power laser B is capable of operation up to approximately 8 mw, the high power laser A is capable of operating beyond 20 mw, and that over the ranges of power outputs of the lasers A, B there is some overlap of wavelength or operating frequency, but also a substantial range where the devices operate at different frequencies. The circled regions 30, 31 in FIG. 2 illustrate regions for the respective beams A, B where, if operation were to be constrained, the beams would produce output radiations at about 779 nm, i.e., at about the same frequency with little frequency shift between beams.

Figure 3:
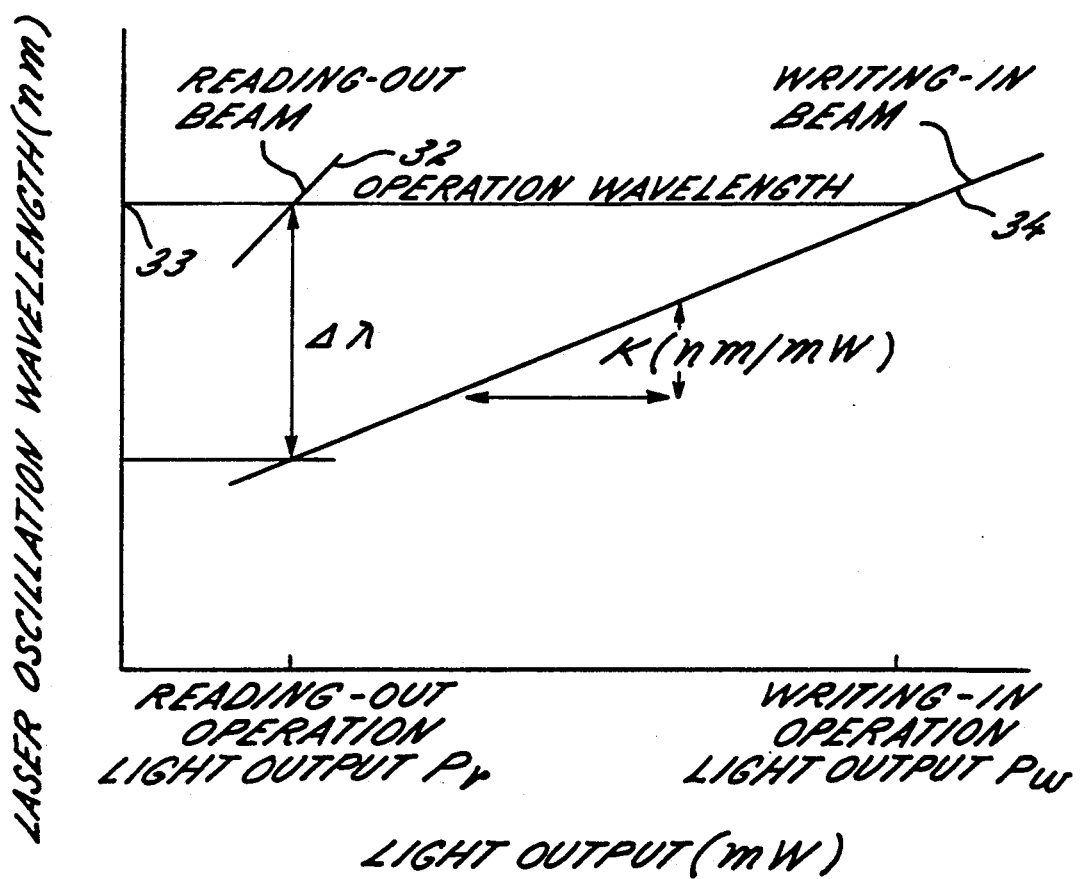
FIG. 3 is a diagram illustrating the coordination of the facet reflectances and operating power levels of the respective sections of the laser device of FIG. 1.

FIG. 3 is a graphical illustration which interrelates some of the factors to be considered in achieving operation of beams A and B at about the same wavelength. More particularly, FIG. 3 shows a porion of the relationship of FIG. 2, including a segment 32 relating operating wavelength to power output of the low power device B at about a center frequency indicated at 33, and a further segment 34 showing the relationship between the high power beam output power and output wavelength, illustrating a slope K relating the change in operating wavelength to the output power.

Before referring in greater detail to FIGS. 2 and 3, it will first be useful to approximate reflectances for the facets of the respective laser devices A, B, then to use those approximated reflectances along with the plots of FIGS. 2 and 3 to further refine not only the reflectance values but also the rated operating power for the lasers, to produce a set of coordinated conditions which, if applied, will produce output light at about the same frequency.

Generally, in order to enhance the light output from the high power laser A, the asymmetrical reflectance coating technique described above is utilized. More particularly, the reflectance of the front facet 13 in which the output window 23 is formed is made as low as practical while the reflectance of the rear facet 15 is made as high as practical to produce a laser cavity with asymmetrical coatings which concentrates the output in the front facet 13. The laser mirror loss $\alpha_M$ of such a device is represented by the following expressiion:

$$\alpha_M = (\tfrac{1}{2}L) \cdot \ln(1/R_f R_r) \tag{1}$$

where L represents the length of the cavity, $R_f$ represents the front facet reflectance, and $R_r$ represents the rear facet reflectance. The laser oscillation threshold current density $J_{th}$ is represented by the following:

$$J_{th} = \frac{d_{AL}}{\eta_i} J_0 + \frac{d_{AL}}{\beta \Gamma_v \eta_i} \cdot (\alpha_i + \alpha_M) \tag{2}$$

where $d_{AL}$ represents the active layer thickness, $\eta_i$ represents the internal quantum efficiency, $J_O$ represents the gain current density, $\Gamma_v$ represents the light confinement coefficient, and $\alpha_i$ represents the internal loss.

The foregoing expressions lead to certain conclusions with respect to the laser cavity A. Considering the low front facet reflectance of the high power laser, expression 1 reveals that the mirror loss $\alpha_M$ for the high power laser will be relatively high. That increased mirror loss when considered in the context of expression 2 leads to the conclusion that the threshold current density $J_{th}$ is increased. Increased threshold current density, in turn, results in an increased minority carrier density in the active layer, tending to shift the wavelength of the laser oscillation in the short wavelength direction end means of the band filling effect.

However, when current flow through the device is increased beyond the threshold level in order to increase the power output $P_O$, the resulting internal heat which is generated in the laser tends to shift the oscillation wavelength $\lambda_p$ toward the longer wavelength end of the spectrum. Such action is illustrated in FIG. 3 which shows an increasing operating wavelength with increased power, and illustrates a relatively straight line relationship relating $\lambda_p$ to $P_O$ having a slope K (nm/mw). Thus, if the low power beam B having the characteristic 32 is driven with a current level sufficient to produce output power $P_r$, the operating wavelength $\lambda$ is illustrated at point 33. If the high power laser A were operated at the same power level $P_r$, due to the different reflectances of its facets, the operating wavelength would be different as indicated by $\Delta\lambda$ in FIG. 3. The graph also shows the slope K of the operating characteristic 34 of the high power beam A, and that movement along that slope would bring the characteristic 34 to an operating point $P_w$ which would also generate output radiation at the wavelength $\lambda$. Taking those geometrical factors into consideration, in order to make the wavelength difference between the readout and write-in beams substantially zero, the following expression should be satisfied:

$$-\Delta\lambda = K(P_w - P_r) = 0 \tag{3}$$

or rearranging the terms:

$$K = \frac{\Delta\lambda}{P_w - P_r} \tag{4}$$

Figure 5:
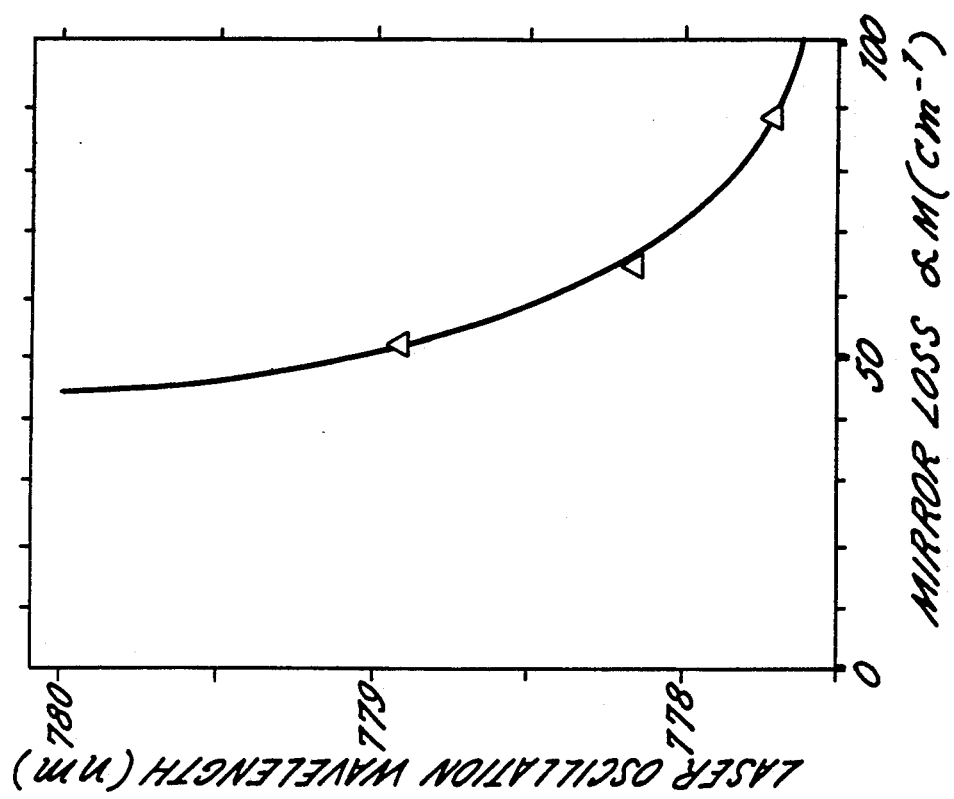
FIG. 5 is a diagram showing the relationship between the laser output wavelength and mirror loss characteristics.
Figure 4:
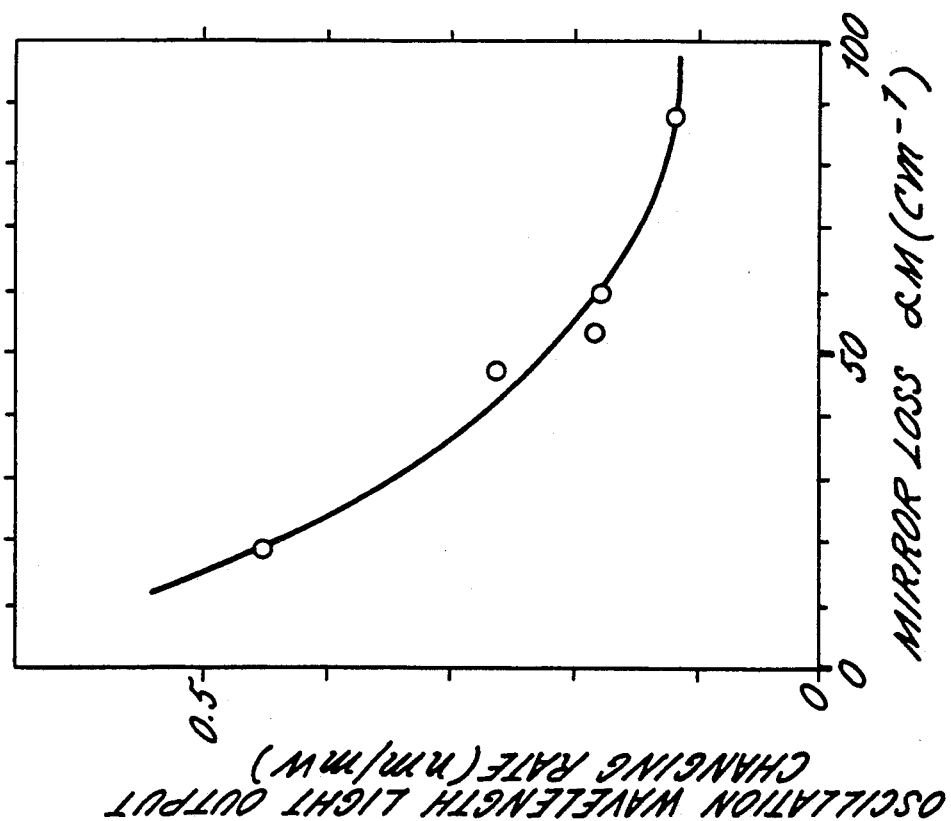
FIG. 4 is a diagram showing the rate of change of laser output wavelength with respect to output power plotted against the mirror loss characteristics.

In applying the relationships diagrammed in FIG. 3 and set out in expression 4, it is useful to know additional operating relationships for the particular laser dvice being configured. Among those relationships is the rate of change of output frequency with respect to power as a function of mirror loss. Another is the actual output frequency as a function of mirror loss. Those relationships for a particular device are illustrated in FIGS. 4 and 5, respectively. FIG. 4 shows measured values of the output wavelength rate of change with respect to power (i.e., the slope K of FIG. 3) as a function of mirror loss $\alpha_M$ for a laser device of the GaAs-/AlGaAs heterostructure type having a cavity length L of 250 microns, an active layer thickness $d_{AL}$ of 0.1 μm, a light confinement coefficient $\Gamma_v$ of 0.2 and an internal quantum efficiency $\eta_i$ of 0.8. In FIG. 4, the horizontal axis represents mirror loss and the vertical axis K, the slope of the characteristic 34 of FIG. 3. It is seen that the rate of change of output frequency is rather sharp at relatively low mirror losses but decreases substantially with increasing mirror losses.

FIG. 5 shows measured values of the laser output wavelength as a function of mirror loss in a laser having the above-described parameters and operated at 3 mw output power. In FIG. 5, the horizontal axis represents mirror loss and the vertical axis laser oscillation wavelength.

As a generality, in configuring such lasers, in order to obtain a low noise characteristic in the reading laser without increasing coupling with the external cavity mode, relatively low reflectances are avoided for the front facet, and such reflectances are preferably on the order of 20% to 30%. On the other hand, the rear facet reflectance $R_r$ is desirably not too high, and is preferably in the range of about 30% to 60%. With respect to the high output power laser, the asymmetrical reflectance coating noted above is preferred. However, in order to avoid the problems of noise in the high power laser, we prefer to keep the rear facet reflectance high but not too high, and the range of 60% to 70% is preferred.

Taking those desirable characteristics and considering them in the context of FIGS. 4 and 5, let it first be assumed that the front and rear facet reflectances for the low power laser will be about the same at about 30%. With the front and rear facet reflectances at 30%, expression 1 is solved for the mirror loss and yields $\alpha_M = 48$ cm$^{-1}$. Assuming, based on the above considerations, that a first iteration for the facet reflectances of the asymmetrically coated high power laser will yield a mirror loss $\alpha_M$ of about 85 cm$^{-1}$, and considering that difference in mirror losses in FIG. 5, it will be seen that a $\Delta\lambda$ between the two lasers of about 2 nm will be achieved. If the lasers are designed for $P_r=3$ mw for the low power laser and $P_w=20$ mw for the high power laser, expression 4 reveals that K should be about 0.12 nm/mw. FIG. 4 confirms for the particular device which was tested that a K of about 0.12 can be achieved at a mirror loss $\alpha_M$ of about 85 cm$^{-1}$. In order to achieve a mirror loss of about 85 cm$^{-1}$ for the high power laser with an asymmetrical coating, it is found that reflectances for the front and rear facets of 2% and 60%, respectively, can be used. Using those factors in expression 1 yields a mirror loss for the high power laser of $\alpha_M=88$ cm$^{-1}$. Thus, it is seen that the selected reflectances yield the mirror losses which utilizes the K slope of the high power beam to achieve a shift in operating frequency of the high power laser which compensates for the $\Delta\lambda$ difference between the low and high power operation (FIG. 3) to yield a result when operated at the rated levels, which approaches a zero nm difference between the two beams.

In order to achieve the above reflectances, and given merely as an example of achieving those particular reflectances in a laser of the aforementioned type, Al$_2$O$_3$ ($\lambda/2$) films 14a, 16a are applied for the front and rear facets of the low power laser to achieve reflectances of 30%. In order to achieve the 2% reflectance for the front facet of the high power laser, an Al$_2$O$_3$ ($\lambda/4$) film 13a is used. Finally, in order to achieve the 60% reflectance for the rear facet of the high power laser, a coating 15a of Al$_2$O$_3$ ($\lambda/4$)/a-Si($\lambda/4$)/Al$_2$O$_3$ ($\lambda/4$) laminated film is applied to the rear facet. In certain cases, other coatings such as Si$_3$N$_4$ can also be used at appropriate wavelength thicknesses in order to achieve desired reflectances.

Figure 6:
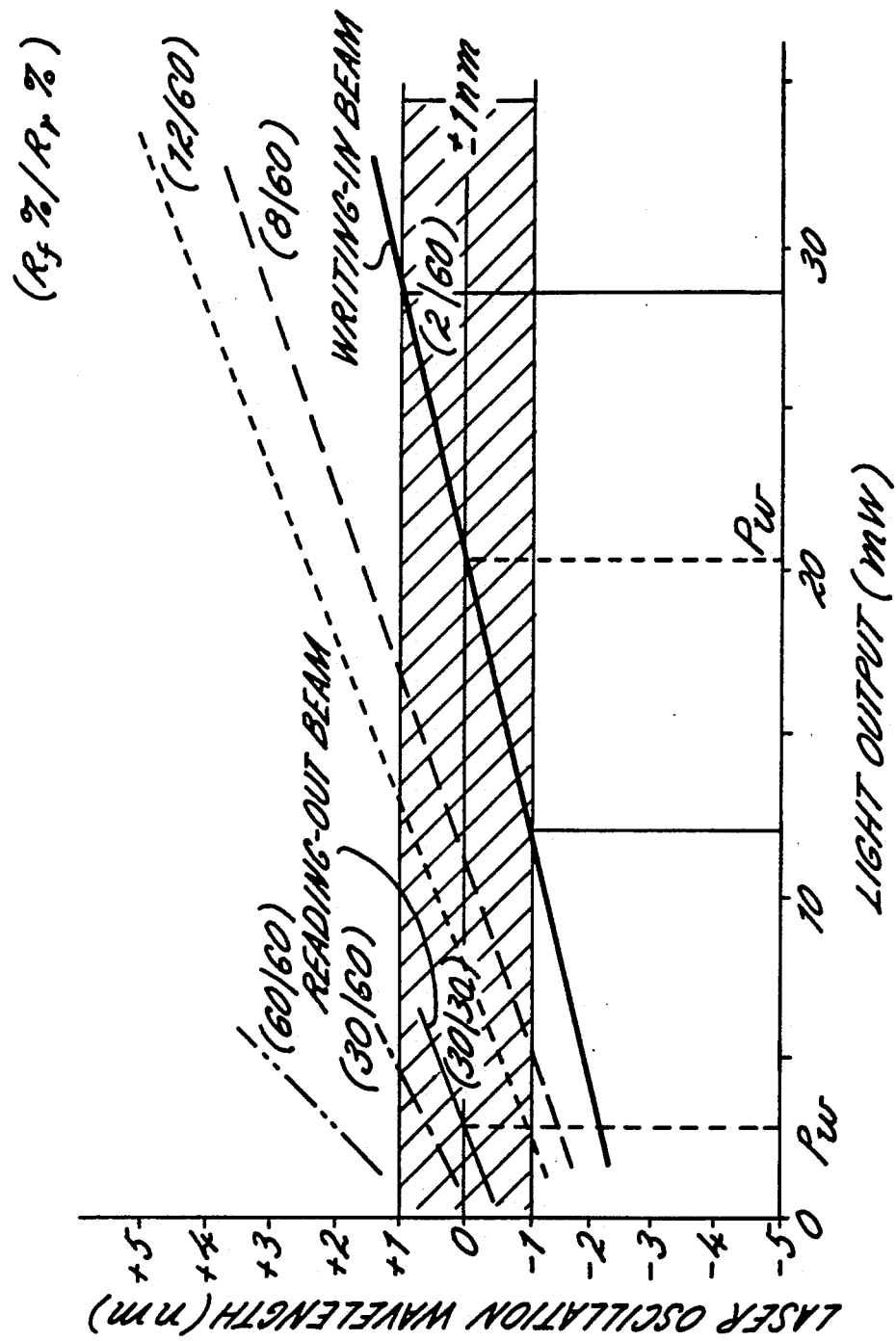
FIG. 6 is a diagram further illustrating the coordination of facet reflectances and power outputs in a laser according to the present invention.
Figure 7:
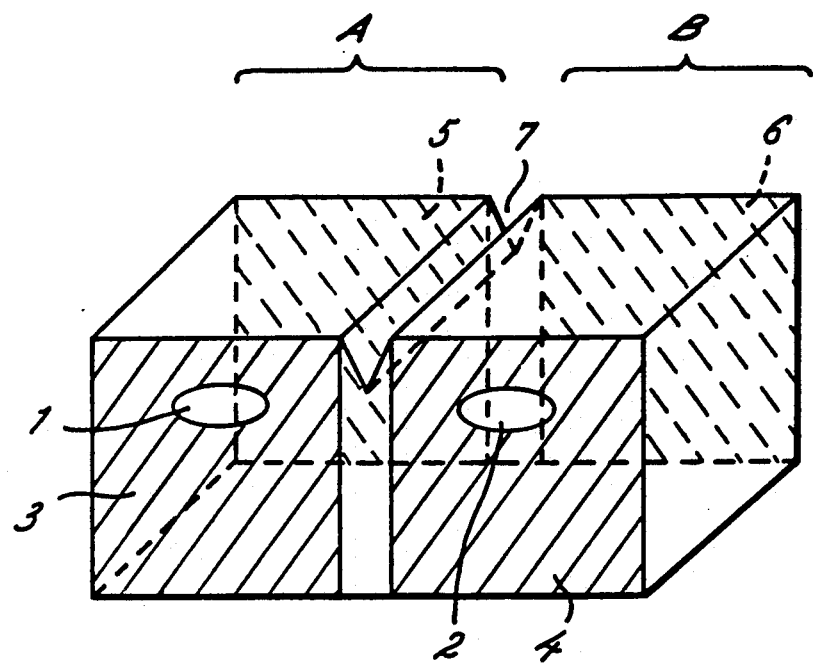
FIG. 7 is a perspective view showing a multiple beam monolithic semiconductor laser exemplifying the prior art.

FIG. 6 better illustrates the result achieved when the facet reflectances and rated power of the two beams of the monolithic device are coordinated as described in detail above. FIG. 6 is similar to FIGS. 2 and 3 in illustrating the light output of the device in mw plotted against the laser oscillation wavelength in nm. There is shown in solid lines at the left of the diagram the low power characteristic for the 30/30 coated low power laser cavity. It is seen that at the output power level $P_r$, which is the rated power output for the low power laser (such as 3 mw in the example), the laser establishes a datum line labeled zero for the output frequency. It is also seen that when the high power laser is coated with the front facet having a 2% reflectivity and a 60% rear facet reflectivity, the characteristic shown in solid lines adjacent the (2/60) identifier is produced. It is seen that a substantial portion of the slope of that line is encompassed within the shaded $\pm 1$ nm band about the operating frequency of the low power laser. It is furthermore seen that the reflectances of the high power beam are coordinated to those of the low power beam such that the operating point $P_w$ of 20 mw in the selected example falls precisely at the same operating frequency as the operating frequency of the low power beam when the low power beam is operated at its rated level. Thus, when the lasers are coated to produce 30/30 reflectances to the low power laser and 20/60 reflectances for the high power laser and those devices are operated at 3 mw and 20 mw respectively, the operating frequency is substantially the same. If the operating power of the low power beam is changed within any reasonable bounds, it is seen that the operating frequency of that low power device remains within $\pm 1$ nm of the desired frequency. With respect to the high power beam, it is seen that the operating power can be changed from 12 to 28 mw and still produce an output frequency within 1 nm of the desired operating point. The substantial margin for error or operating tolerance when using a device so configured will thus be apparent.

The diagram further illustrates the manner in which lasers having facet reflectances not coordinated to each other and to the rated operating power will fail to produce the desired result. Thus, if the high power beam of 2/60 illustrated in solid lines is used with a low power laser of 30/60 or 60/60 as illustrated in dashed lines, there is little if any chance of overlap in operating frequency, and the chromatic aberration difficulties described above will follow. Similarly, if a 30/30 low power beam is utilized but with a high power beam of 8/60 or 12/60 as illustrated in dashed lines in FIG. 6, it will not be possible to operate the high power beam at the desirable 20 mw output and still achieve the substantially identical operating frequency as achieved by the low power laser.

FIG. 6 demonstrates that a number of variables are available in configuring a multibeam monolithic laser according to the invention, and that such variables must be in predetermined coordination with each other in order to achieve the desired result of substantially identical wavelength output in both the low and high power devices. Thus, when operating the low power laser, it is desirable to have reflectances at the front and rear facets in the range between 25% and 33%, for the reasons noted above as well as for coordination with the reflectances of the high power laser and the rated power outputs of the respective devices. Further, in practicing the invention, it will be necessary to achieve reflectances in the high power laser in the range between 1% and 4% at the front facet and in the range between 50% and 65% at the rear facet. Desirably, the low power laser is operated in the 2 to 4 mw range, whereas the high power laser is operated in the 18 to 20 mw range. Finally, in defining substantially the same wavelength for both beams, that definition encompasses wavelengths which are as practically close as possible, but in no case greater than 2 nm apart, such as the $\pm 1$ nm about nominal illustrated in FIG. 6. In implementing a particular device within those ranges in a preferred embodiment of the invention, the front and rear facets of the low power laser are coated to have the same reflectivity at about 30%, and the low power laser is operated at about 3 mw. Similarly, the high power laser is coated to have front and rear facet reflectivities of 2% and 60% respectively, and the high power laser is nominally operated at 20 mw. Those factors achieve the particular conditions illustrated in FIG. 6 which are seen to satisfy the aims and objects of the invention. Using a different laser, or operating at different points in the range, it will still be possible to achieve the desired goals, and thus the claims presented herein are intended to encompass such lasers which incorporate the spirit and scope of the invention as taught herein and illustrated in the particular example.

It was also noted above that the dual beam device was disclosed as the preferred embodiment because of its particular applicability to DRAW optical disk systems. However, it will now be apparent to those skilled in the art that the invention taught herein can be applied to multiple beam lasers of greater than 2 beams, and which can operate at 2 or more power levels as desired.

It will thus be apparent that what has been provided is a novel monolithic multibeam laser in which at least one of the beams operates at low power and another at high power. The reflectances of the facets of the cavities which produce the low and high power beams are coordinated to each other, and to the power requirements of the respective lasers and to the noise characteristics desired of those lasers in order to not only meet those criteria but also in such a way that the beams of both lasers are at about the same operating frequency. As a result, chromatic aberration in the optical systems associated with such monolithic lasers need not be compensated for. The invention also provides a method for configuring such a laser to operate in an environment where chromatic aberration would be a problem if the beams operating at two substantially different power levels did not operate at nearly precisely the same frequency.

What is claimed is:

1. A monolithic laser having at least two laser sections for producing at least a low output power beam and a high output power beam, the monolithic laser comprising, in combination:

a cavity for the low power beam having front and rear facets coated to have reflectances in the range between about 25% and 33%, the low power cavity also having a rated output power which is coordinated with the front and rear facet reflectances to produce output radiation at a predetermined wavelength;

a cavity for the high power beam having front and rear facets, the front facet being coated to have a reflectance in the range between about 1% and 4%, the rear facet being coated to have a reflectance in the range of about 50% to 65%, the high power cavity having a rated output power coordinated with the reflectances of said front and rear facets to produce radiation when operated at the rated power which is within about 1 nm of the predetermined wavelength of the low power beam.

2. The monolithic laser as set forth in claim 1 wherein:

the front and rear facets of the low power cavity are coated to have reflectances of about 30%, the low power cavity is arranged to produce said predetermined wavelength when operated at about 3 mw;

the front facet of the high power cavity is coated to have a reflectance of about 2% and the rear facet a reflectance of about 60%, and the high power cavity is arranged to produce light of said predetermined wavelength when operated at a rated power of about 20 mw.

3. The monolithic laser as set forth in claim 2 wherein the spacing between the two beams is on the order of 100 microns.

4. The monolithic laser as set forth in claim 1 wherein the front and rear facet coatings of the low power laser comprise $Al_2O_3$ having a thickness of about $\lambda/2$ at the operating wavelength, the coating on the front facet of high power laser comprises an $Al_2O_3$ having a thickness of about $\lambda/4$ at the predetermined wavelength, and the coating on the rear facet of the high power cavity comprises $Al_2O_3$ ($\lambda/4$)/a-Si($\lambda/4$) /$Al_2O_3$($\lambda/4$) composite film having the indicated thicknesses at about the predetermined wavelength.

5. A method of fabricating a monolithic laser having at least two beams including a high output power beam and a low output power beam, the method comprising the steps of:

coating front and rear facets of a cavity producing the low output power beam to produce reflectances in the range between about 25% and 33%;

establishing an output power rating for the low power beam which is coordinated with the reflectances of the front and rear facets to produce output radiation at a predetermined wavelength;

coating facets of a cavity which produces the high output power beam to produce a front facet reflectance in the range between about 1% and 4% and a rear facet reflectance in the range between about 50% and 65%; and establishing an output power rating for the high power beam which is coordinated with the reflectance of the front and rear facets to produce output radiation at a wavelength within about 1 nm of said predetermined wavelength.

* * * * *